United States Patent [19]

Minner et al.

[11] 4,087,813
[45] May 2, 1978

[54] CIRCUIT FOR PRODUCING DIRECT VOLTAGES FROM PULSES

[75] Inventors: Willy Minner, Schwaigern; Bernhard Rall, Ulm, both of Germany

[73] Assignee: Licentia Patent-Verwaltungs-G.m.b.H., Frankfurt am Main, Germany

[21] Appl. No.: 706,480

[22] Filed: Jul. 19, 1976

[30] Foreign Application Priority Data

Oct. 31, 1975 Germany .............................. 2548762
Jul. 17, 1975 Germany .............................. 2531945

[51] Int. Cl.² .......................................... H03K 13/02
[52] U.S. Cl. ...................... 340/347 DA; 235/92 TF; 325/420
[58] Field of Search ........... 340/347 DA; 235/92 TF, 235/92 CC; 325/420

[56] References Cited

U.S. PATENT DOCUMENTS

| | | | |
|---|---|---|---|
| 3,603,977 | 9/1971 | Szabo et al. | 340/347 DA |
| 3,629,710 | 12/1971 | Durland | 235/92 TF X |
| 3,681,707 | 8/1972 | Bean | 235/92 TF X |
| 3,836,908 | 9/1974 | Hegendorfer | 340/347 DA |
| 3,942,171 | 3/1976 | Haraszti et al. | 340/347 DA |

FOREIGN PATENT DOCUMENTS 2,323,539  8/1974  Germany.

OTHER PUBLICATIONS

Reiner, MOS Integrated Digital-Analog Converter, Funk-Technik, No. 7, 1975, pp. 180-184.
Texas Instruments Deutschland GmbH Application Laboratory, The TTL-Cookbook, pp. 154-157 (date established) 5/10/1976.

Primary Examiner—Thomas J. Sloyan
Attorney, Agent, or Firm—Spencer & Kaye

[57] ABSTRACT

A circuit, for producing direct voltages, for example the tuning voltages for a television or radio receiver, lying within a direct voltage range from pulses fed to an integrating circuit at whose output the direct voltages appear. A plurality of pulses (I) are fed to the integrating circuit, at whose output the direct voltage ($U_J$) appears, within a period duration (T) assigned to the desired direct voltage range, with the period duration (T) being at least of the magnitude $T = (U_{max} - U_{min}) \cdot \Delta \tau / \Delta U_J$, where ($U_{max} - U_{min}$) is the desired direct voltage range, $\Delta \tau$ is the shortest time duration of a pulse (I) and $\Delta U_J$ is the smallest voltage step width associated with the shortest pulse duration $\Delta \tau$ by which two different direct voltages ($U_J$) at least differ from one another.

9 Claims, 17 Drawing Figures

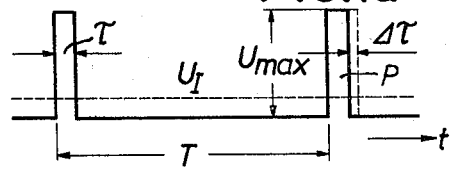
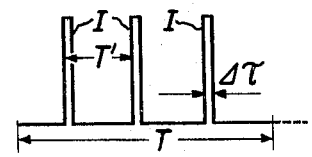
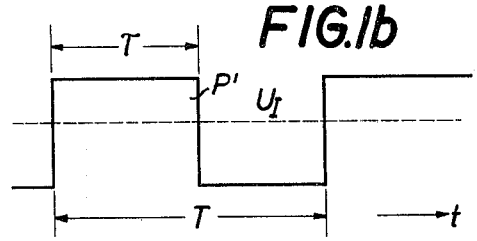
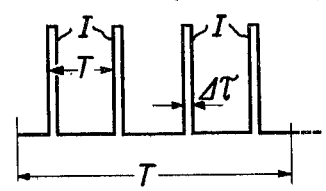
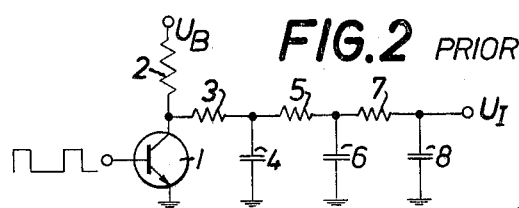
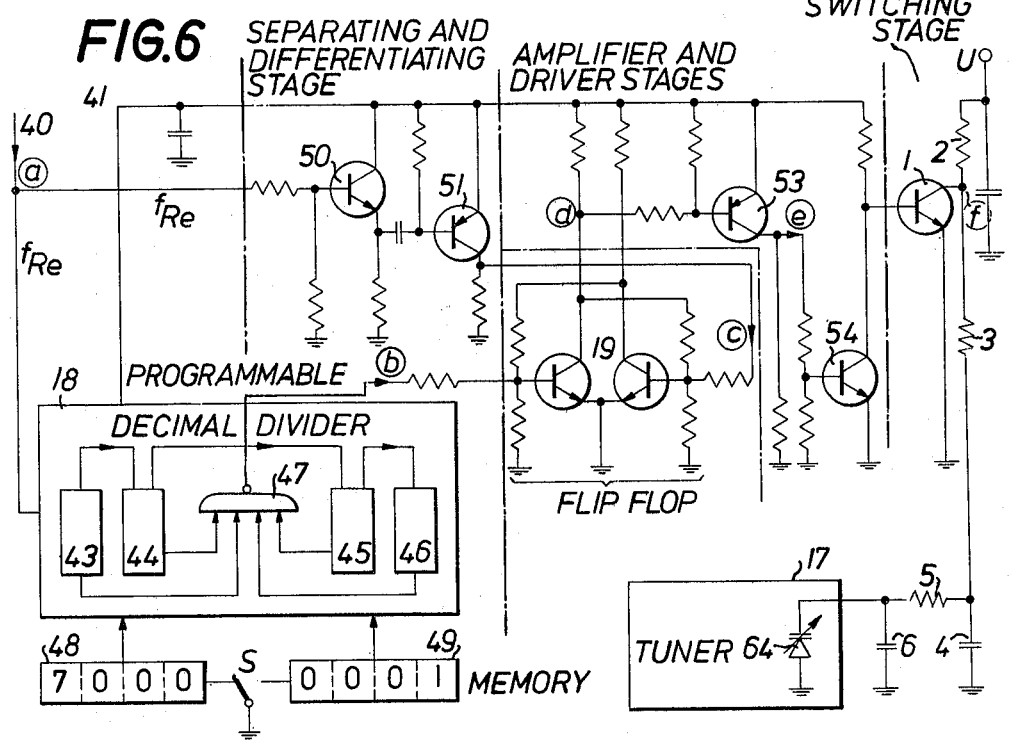

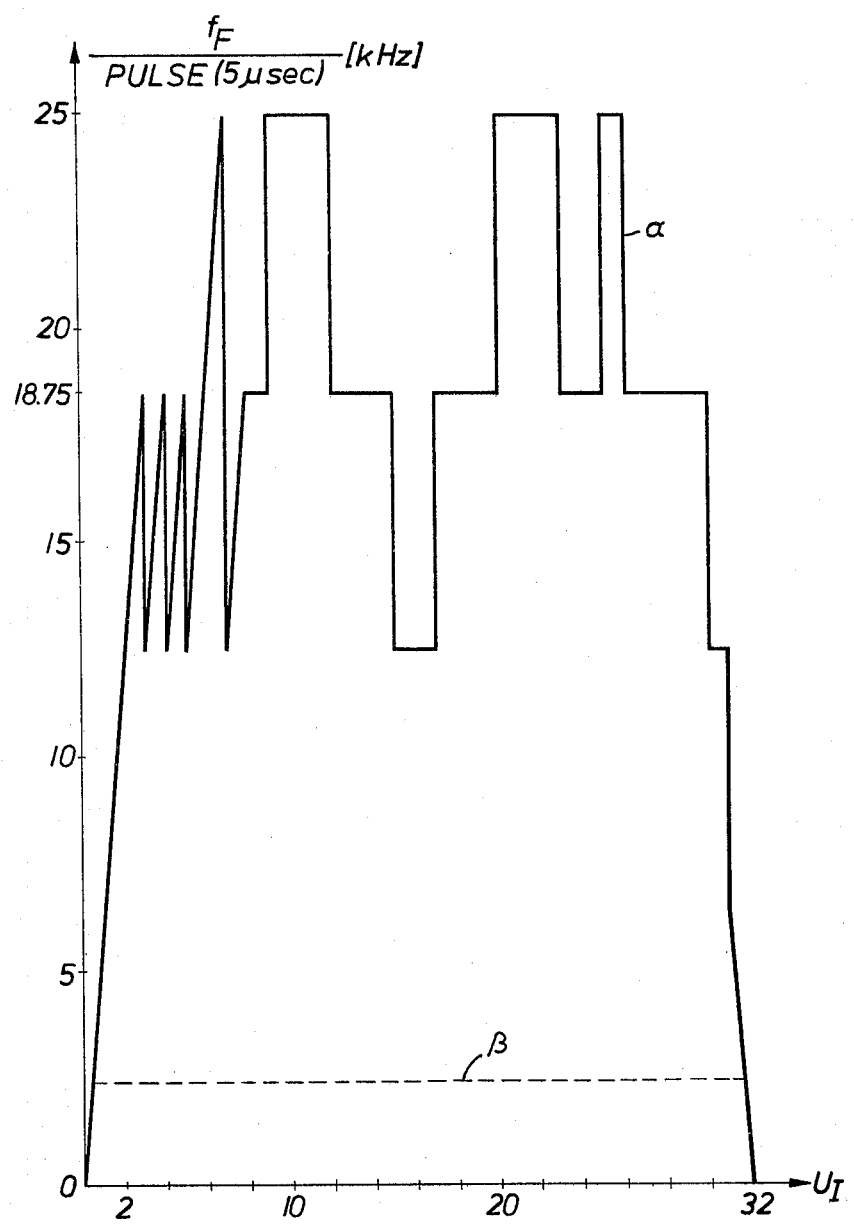

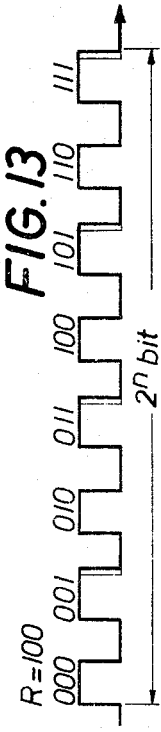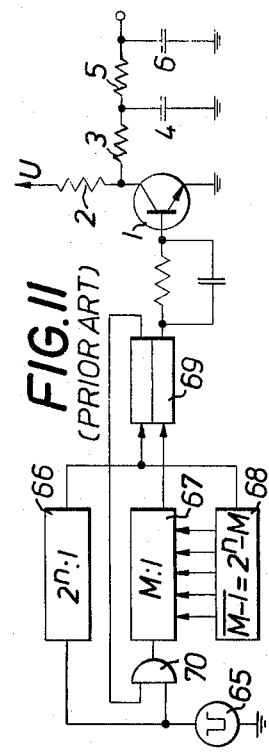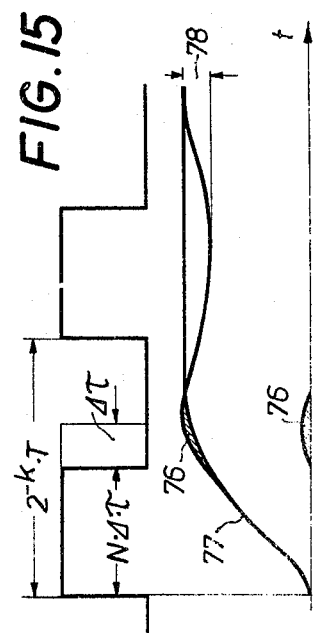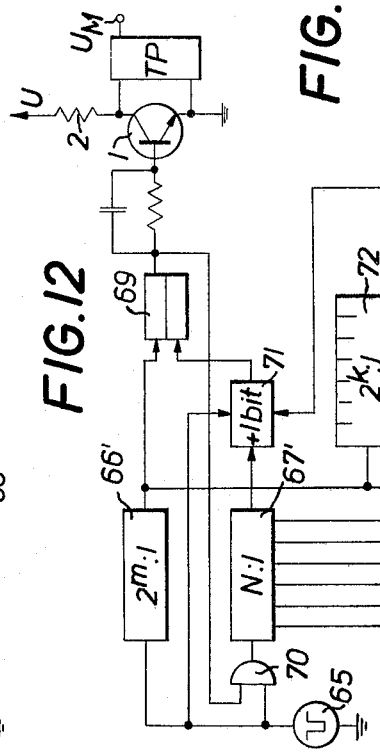

CIRCUIT FOR PRODUCING DIRECT VOLTAGES FROM PULSES

BACKGROUND OF THE INVENTION

In the circuit are there often exists the desire to convert digital signals to analog signals. Recently, for example, analog curcuits have been substantially replaced by digital circuits. In this case, it is necessary to change back to analog values at the points of intersection with other circuits which cannot be realized digitally. Thus a digital/analog converter is required.

An example for this exists in radio receivers when selected tuning frequencies for various stations have been stored as binary numbers in a memory (e.g. a semiconductor memory) so that they can be selected for tuning and must then be converted to a direct voltage to be applied to the variable capacitance diodes.

In a circuit disclosed in the periodical "Funk-Technik" [Radio Art], 1975, Issue No. 7. pages 180–184, a direct voltage is produced by feeding the rectangular voltage generated by an oscillator in the form of periodic pulses to a lowpass filter which acts as an integrating member. An electronic switch is provided which switches a battery voltage via a resistor to the lowpass filter in the rhythm of the pulse repetition frequency. Due to the integrating effect of the lowpass filter, the time average of the pulses is filtered out and the analog value, i.e., the value of the direct voltage at the output of the lowpass filter, depends upon the keying ratio. Thus a desired direct voltage value is produced by the selection of the keying ratio which is the ratio of the quotient of the pulse duration to the period duration.

It has been found, however, that the known circuits are often insufficient as will be explained below. As already expressed, a digital/analog converter includes an electronic switch which switches a battery voltage $U_B$ via a resistor to an integrating circuit in the rhythm of the pulse repetition frequency $f_I$. If the switch-off period of the switch is called $\tau$ and the period duration T, the direct voltage present at the output of the integrating circuit $U_I = U_B \cdot \tau/T$. The direct voltage $U_I$ has an alternating voltage $U_R$ superposed on it, which is also called the ripple voltage. This ripple voltage corresponds to the pulse repetition frequency $f_I = 1/T$. If $U_R$ is to be small, the time constant of the integrating circuit must be large compared to the pulse repetition frequency, i.e., the limit frequency of the lowpass filter forming the integrating circuit must be much lower than the pulse repetition frequency $f_I$. However — as will be explained below — since the latter must not be selected too high, the limit frequency must be relatively low, i.e., the lowpass filter must be relatively narrowbanded. This has the result that upon a change of the keying ratio $\tau/T$, a relatively long time occurs until the voltage $U_I$ has reached its new stationary value since the time constant in a narrowbanded lowpass is relatively great.

This will be explained with an example. In this example it is assumed that direct voltages $U_I$ can be set within a direct voltage range of 0.5 to 29.5 V in desired steps of 3 mV, i.e., 0.500 - 0.503 - 0.506 V etc., by a change in the keying ratio $\tau/T$. The steps of 3mV determine the step width $\Delta U_I$. The battery voltage $U_B$ is assumed to be 30 V. Under the above conditions there results the keying ratio $\tau/T$ of 0.0166 for $U_I = 0.5$ V and
0.9833 for $U_I = 29.5$ V For the step width of $\Delta U_I = 3$ mV the corresponding change in keying ratio is $\Delta \tau/T = 1 \cdot 10^{-4}$.

If $\Delta \tau$ is selected to be 5 μsec, which corresponds to a switching frequency of 200kHz, the period duration T = 50 msec, corresponding to a pulse repetition frequency of 20Hz. Thus a period duration T = 50 msec contains 10,000 of these 5 μsec intervals so that 10,000 direct voltages can be generated which differ by 3 mV. The smallest change (e.g. increase) in a direct voltage $U_I$ by $\Delta U_I = 3$ mV is effected in that the periodic pulses which produce the direct voltage $U_I$ in question are lengthened by $\Delta \tau = 5$ μsec in their time duration. If in this case the ripple voltage $U_R$ is to be about 3 mVpp (from peak to peak) this requires, for a five stage RC integrating circuit, a time constant for the integrating circuit which results in a stationary value of the direct output voltage $U_I$ after about 5 seconds. This long transient period is a drawback, however, particularly during a change from a first to a second desired direct voltage. In the known circuit a relatively long time is required for a change in the keying ratio $\tau/T$ until the direct output voltage has reached its stationary value.

It could be attempted to increase the pulse repetition frequency, and thus shorten the period duration T, so that a lowpass filter with a higher limit frequency, i.e., shorter transient time, could be used. However, there are limits to the increase in frequency in the known circuit since the accuracy of the analog voltage and the required large number of direct voltages values which differ by $\Delta U_I$ require a relatively long period duration T and therefore do not permit a decrease in T to eliminate the above-mentioned drawbacks.

It must also be considered that with a short period duration T the above-mentioned minimum time interval $\Delta \tau$ would have to be shortened which would result, under certain circumstances, in a technically set minimum value for $\Delta \tau$. On the other hand it is not possible to shorten T if $\Delta \tau$ remains constant since in that case the desired smallest value for $\Delta U_I$ for the direct voltage could no longer be attained.

High accuracy in the direct voltage, i.e., a low ripple voltage $U_R$, is required, for example, if the voltage is to serve as the tuning voltage for a radio or television receiver. In order to be able to keep the ripple of the direct voltage at the output of the lowpass filter within acceptable limits, this requires, in the known circuit, expensive and complicated lowpass filters whose limit frequency is relatively low and whose filter edges are very steep with a disadvantageously long transient time.

SUMMARY OF THE INVENTION

It is the object of the present invention to provide a circuit for producing direct voltages from pulses in which the direct voltages do not exhibit much ripple and can be set very accurately without having a long transient period and without requiring the use of complicated lowpass filters.

The above object is basically achieved according to the invention in that in a circuit for producing direct voltages lying within a direct voltage range from pulses fed to an integrating circuit at whose output the direct voltages appear, the desired direct voltage value $U_I$ within a given range is produced by feeding a plurality of pulses (I) to the integrating circuit within a period duration (T) assigned to the desired direct voltage range, the period duration (T) being at least of the magnitude $T = (U_{max} - U_{min}) \cdot \Delta \tau/\Delta U_I$, where $(U_{max} - U_{min})$ is the desired direct voltage range, $\Delta \tau$ is the shortest time duration of a pulse (I), and $\Delta U_I$ is the smallest step width associated with the shortest pulse $\Delta\tau$ by which two different direct voltages ($U_I$) at least differ from one another.

Thus, the present invention is based on a defined minimum period duration T which can be expressed by the formula $$T = (U_{max} - U_{min}) \cdot \Delta\tau/\Delta U_I$$

The term ($U_{max} - U_{min}$) describes the direct voltage range which includes the desired direct voltages to be produced. It is further assumed that a certain voltage step width $\Delta U_I$ is required which has associated to it a minimum time interval $\Delta\tau$. The association is such that a pulse of the time duration $\Delta\tau$ which occurs once within the period duration T, exactly produces one direct voltage of the value $\Delta U_I$. The time duration $\Delta\tau$ is thus the time duration of the smallest required pulse. The above-mentioned formula indicates that the period duration T must be at least enough that the shortest pulse of time duration $\Delta\tau$ can be accommodated therein as many times as steps $\Delta U_I$ are required. The period duration T is thus equal to the product of $\Delta\tau$ multiplied by the number F of the different direct voltage values desired in the direct voltage range (T = F · $\Delta\tau$ with F · $\Delta U_I = (U_{max} - U_{min})$).

In the present invention, in contradistinction to the known circuit, the direct voltage is not produced by a single pulse per period duration T but by a plurality of pulses I distributed over the period duration T and fed to the integrating circuit, e.g., a lowpass filter. The area of pulses I fed to the integrating circuit during period duration T for each direct voltage is equal to the area of the individual pulse fed to the integrating circuit during period duration T in the known circuit to obtain the respectively same direct voltage. Since the individual pulse which appears in the known circuit during period duration T is divided, according to the present invention, into a plurality of pulses, the sum of these pulse durations is equal to the pulse duration of the individual pulse. The pulses distributed over period duration T produce the same direct voltage value as the single pulse. Since this direct voltage, however, is produced from many smaller pulses during the same period duration T on which the known circuit would likewise be based, the superposed residual alternating voltage (ripple voltage) is much less in the case of the same lowpass filter.

In the present invention it is thus possible in an advantageous manner to use a lowpass filter with a relatively wide bandwidth, i.e., with a relatively high limit frequency so that the transient period is reduced. The bandwidth can be wide because the spectral lines of the pulses fed to the lowpass filter lie at higher frequencies than if there were only a single pulse within the period duration T in question. In the present invention the period duration T can be large enough, under consideration of the required accuracy, so that in spite of a small ripple voltage and in spite of a short transient period for the lowpass filter, a sufficient number of direct voltages differing by $\Delta U_I$ can be produced.

The drawbacks of the known circuits in which a pulse duration modulation with variable time durations $\tau$ and constant period duration T takes place can be overcome with the present invention, for example, if the time durations $\tau$ of the plurality of pulses distributed over the period duration T are kept constant and the pulse interval durations are varied to correspond to the desired direct voltage. In order to distinguish the variable pulse edge distance occurring in this case from the constant period duration T within which the plurality of pulses occur, the variable pulse edge distance, which is equal to the time duration between the front edges of two successive pulses and is varied in dependence on the tuning voltage desired at the output of the integrating circuit, will hereafter be called T' instead of T. If, for example, the constant time duration $\tau$ for the pulses I is equal to $\Delta\tau = 5$ $\mu$sec, it follows that according to the equation $U_I = U_B \cdot \tau/T$ (with $U_B = 30$ V), that with:

$U_I = 0.5$ V, $\tau/T' = 0.5$ V/30 V = 0.0166 and T' = 5 $\mu$sec/0.0166 = 0.3 msec;

and $U_I = 29.5$V, $\tau/T' = 29.5$V/30 V = 0.9833 and T' = 5 $\mu$sec/0.9833 = 5.085 $\mu$sec.

The pulse interval modulation (of pulse edge distances T') in this case increases, for example, the pulse repetition frequency, compared to pulse duration modulation in the known circuit with otherwise identical conditions, by the factor 166.66 which is a result of the ratio of T = 50 msec to T' = 0.3 msec. This permits a reduction in the time constant of the integrating circuits by the above factor for a ripple voltage of $U_R = 3$mVpp so that the transient period until a stationary value of the direct output voltage is reached is only about 50 msec.

BRIEF DESCRIPTION OF THE DRAWINGS

FIGS. 1a and 1b show pulse diagrams for a prior art circuit.

FIG. 2 shows a circuit including an electronic switch with series-connected lowpass filter according to the prior art.

FIGS. 3a and 3b are basic pulse diagrams used in explaining one embodiment of the present invention.

FIG. 6 is a circuit diagram of the embodiment of FIG. 5.

FIG. 10 is a graphic representation of the frequency resulting with the use of a divider according to FIG. 8 and according to FIG. 12 in dependence on the produced direct voltage.

FIG. 11 is a block circuit diagram for producing pulses of FIG. 1 with variable pulse width according to the prior art.

FIG. 12 shows a further embodiment of a circuit according to the invention which is a modification of that shown in FIG. 11.

FIGS. 13–15 are graphic representations used in explaining the operation of the embodiment of FIG. 12.

DESCRIPTION OF THE PREFERRED EMBODIMENTS

Figure 4:
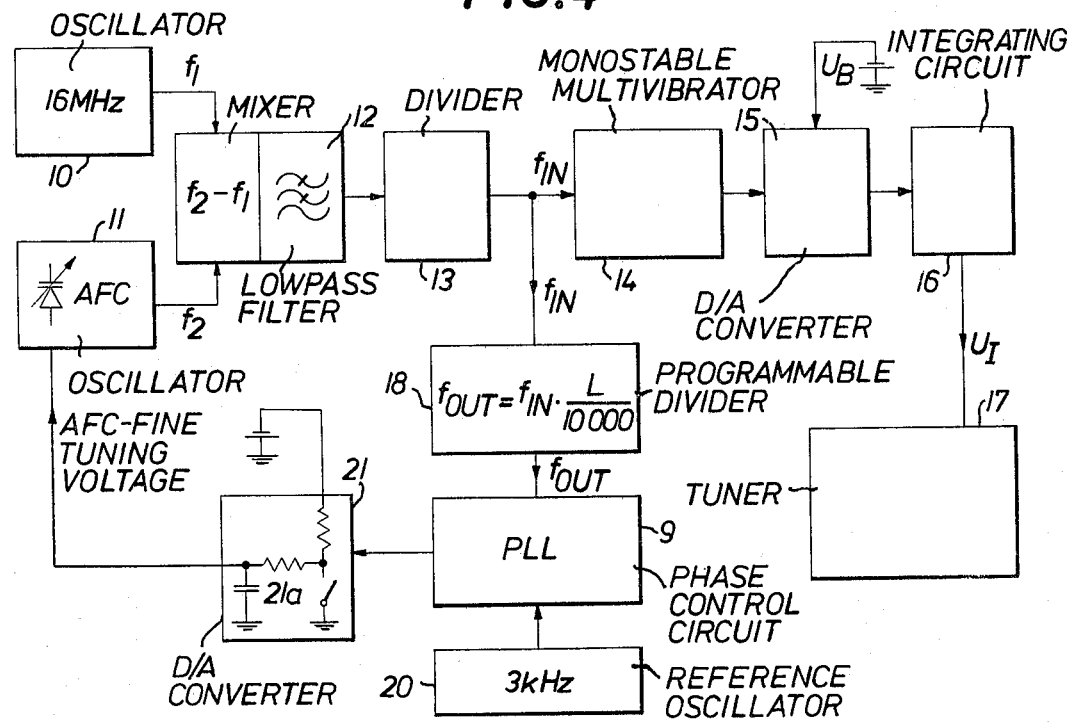
FIG. 4 is a block diagram of an embodiment of the invention.

For better understanding of the invention, a known pulse diagram shown in FIG. 1a will first be described. FIG. 1a shows a sequence of periodic pulses P which have a pulse width $\tau$. These individual pulses P which each occur once within the period duration T, are fed in FIG. 2 in a known manner to a lowpass filter 3-8 via an electronic switch 1,2. The area of the individual pulse P is a measure for the magnitude of the direct voltage $U_I$ produced at the output of the lowpass filter. This direct voltage is known to be calculated according to the formula $$U_I = \tau/T \cdot U_{max}$$

where $U_{max}$ is the amplitude of the pulse which, in the illustrated case, is equal to voltage $U_B$ in FIG. 2. While the individual pulses P of FIG. 1a produce a relatively low direct voltage $U_I$, the pulses P' of FIG. 1b produce a higher direct voltage $U_I$ because of the longer pulse duration $\tau$ with the same period duration T. The pulse duration $\tau$ in FIG. 1b differs from the pulse duration $\tau$ in FIG. 1a by several minimum time intervals $\Delta\tau$ where $\Delta\tau$ is the shortest discrete step width required to change the pulse width (shown in dashed lines in FIG. 1a). As already mentioned above, in the known circuit the new direct voltage value after a change in pulse duration $\tau$ from that of FIG. 1a to that of FIG. 1b will appear only after a relatively long period of time due to the transient period of the lowpass filter 3-8.

FIG. 3a shows that, according to the invention, the individual pulse P shown in FIG. 1a (this means the one pulse within period duration T) is practically divided into a plurality of pulses I which are distributed over the entire period duration T and whose minimum pulse duration $\tau$ maya be equal to the minimum time intrval $\Delta\tau$.

The three pulses I in FIG. 3a, each of whose pulse duration, for example, is equal to the minimum time interval $\Delta\tau$, together take up the same area as the individual pulse P of FIG. 1a. For a single step $\Delta U_I$ of the direct voltage, for which in the known circuit the individual pulse of FIG. 1a would be widened by $\Delta\tau$ within period duration T, use of the present invention provides, as shown in FIG. 3b, the addition of a further pulse I of pulse duration $\Delta\tau$ within period duration T. The corresponding applies for further steps, until for the maximum direct voltage $U_{max}$ all spaces are filled. The sum of the areas of the four pulses I in FIG. 3b is equal to the area of the individual pulse P of FIG. 1a widened by $\Delta\tau$.

FIGS. 1a, 1b, 3a, and 3b serve to explain the principle of the present invention. In fact, in practice the minimum time interval $\Delta\tau$ is much shorter than illustrated compared to the period duration T.

While the period duration T of FIGS. 3a and 3b need not be changed with respect to the period duration of FIGS. 1a and 1b and is kept constant once it has been determined, the time interval T' of FIGS. 3a and 3b between two successive pulse edges is varied in dependence on the direct voltage desired at the output of the integration circuit while the pulse durations of pulses I remain constant. The period duration T is calculated from the equation $T = (U_{max} - U_{min}) \cdot \Delta\tau/\Delta U$ where $\Delta\tau$ is the shortest time duration of a pulse, $\Delta U$ is the desired shortest step width of the direct voltage and $(U_{max} - U_{min})$ is the desired direct voltage range. T' results from the equation $T' = (U_{max} - U_{min}) \Delta\tau/U_I$ in dependence on the desired direct voltage $U_I$ present at the output of the integrating circuit.

The distribution of the many pulses I within period duration T need not be uniform. It is also possible to select the pulse duration of the pulses distributed over period duration T to be different and to provide a constant number of pulses within period duration T (FIGS. 11, 13). Another possibility as described above, is to select the pulse durations of all pulses to remain uniform and to vary only the number of pulses according to the desired direct voltage value. In any case the direct voltage is produced from a relatively large number of pulses within period duration T so that only a very low residual alternating voltage (ripple voltage) results. (Only at the lowest direct voltage of the value $\Delta U_I$ is there a single pulse of pulse duration $\Delta\tau$ within period duration T. This pulse is advantageously disposed in the middle of period duration T.) Since period duration T need not be changed from that of FIG. 1a, a sufficient number of intermediate values of the direct voltage can be produced with great accuracy.

Great accuracy of the direct voltage is required, for example, if the voltage is to be used as the tuning voltage for a television receiver operating with variable capacitance diodes. For a possible direct voltage range between 0 ... 30 V and a tuning range of, for example, 400 MHz, the tuning step width is 40 kHz/3mV. The 40 kHz result from the fact that the human eye requires about a 40 kHz change with the present standard to perceive a change on the screen. With a minimum change frequency of 40 kHz there result 10,000 steps for a range of 400 MHz (400 MHz ÷ 40 kHz = 10,000). In a voltage range of from 0 to 30 V these 10,000 steps correspond to a voltage step width of $\Delta U_I = 3$ mV (30 V ÷ 10,000 = 3mV). Consequently, 10,000 different direct voltage values can be realized within period duration T. This accuracy can be achieved with the known digital/analog converter only with a relatively long period duration of, for example, T = 50 msec if a minimum time interval $\Delta\tau$ of 5 $\mu$sec is assumed. To filter out the ripple voltage to an acceptable value (e.g. 3 mV) filters are required in the known circuit which have a relatively long transient period at T = 50 msec (in the embodiment about 5 seconds) which is not acceptable.

In the present invention, however, the transient time can be reduced considerably, e.g., to 0.2 seconds, in spite of the requirement for accuracy. This value can be considered to be sufficiently short for a change from one station to another. Since the spectrum of the pulses distributed according to the invention over period duration T lies substantially in the range of higher frequencies, only a very small residual alternating voltage remains without the use of complicated filters, which voltage lies, for example, in the order of magnitude of the above-mentioned step width of 3 mV. The filter in the present invention may be, for example, a lowpass filter including two RC stages.

In the embodiment of a circuit according to the invention described below in connection with FIG. 4 a plurality of pulses of constant pulse duration (pulse width) are produced which are distributed as uniformly as possible and the magnitude of the desired direct voltage is given by the number of these pulses within period duration T.

Thus a pulse interval modulation takes place with respect to the distances of the pulses, pulse interval T' here being understood as the interval — i.e. the spacing — between two consecutive positive slope pulse edges (see FIGS. 3a and 3b). With the prerequisite that the tuning voltage is to be variable between 0 and 30 V, the voltage step width is to be $\Delta U_I = 3$ mV and the pulses have a pulse duration $\tau$ of 5 $\mu$sec which corresponds to the minimum time interval $\Delta\tau$, the interval duration T' must be variable between 0.3 msec (corresponding to 3.33 kHz) and 5.085 $\mu$sec (corresponding to 197.706 kHz). The period duration T within which the pulses are distributed is T = 10,000 · 5 $\mu$sec = 50 msec, because $\Delta U_I = 3$ mV is contained 10,000 times in the direct voltage range 0 ... 30 V.

The above frequencies are formed in FIG. 4 by mixing (difference formation $f_2 - f_1$) of the frequency $f_1$ of, for example 16 MHz, produced in oscillator 10 and the frequency $f_2$ from an AFC oscillator 11 which can be fine-tuned by means of a fine tuning voltage between 16.033 MHz and 17.977 MHz. A lowpass filter 12 filters the mixed product so that the difference $f_2 - f_1$ appears at the output of lowpass filter 12. A 10:1 divider 13 is connected in series with the lowpass filter and at its output appear the desired frequencies $f_{IN}$ between 3.33 kHz and 197.706 kHz. The respective frequency $f_{IN}$ is fed to a triggered monostable multivibrator 14 which produces output pulses of a duration of 5 $\mu$sec with a repetition frequency $f_{IN}$ and feeds them to the digital-/analog converter 15. The direct output voltage $U_I$ obtained at the output of integration circuit 16 is fed, for example, to the tuner 17 of a television receiver (not shown), which operates with variable capacitor tuning and tunes the receiver to the desired receiving frequency in dependence on the applied voltage $U_I$.

Frequency $f_{IN}$ is also utilized to obtain the fine tuning voltage for AFC oscillator 11 and is fed to a programmable frequency divider 18 which divides the applied frequency $f_{IN}$ corresponding to the selecte value of a number L into the output frequency $$f_{OUT} = f_{IN} \cdot L/10,000$$

where L can be programmed as a whole number value. The number L may take on a whole number value between 0 ... 9999, i.e. it indicates the number of steps $\Delta U_I$ (here 10,000 steps). The number L thus determines the value of the selected direct voltage $U_I$, 10,000 different values being possible. Each value of L has assigned to it a certain frequency $f_{IN}$, i.e. a certain number of pulses of pulses width $\Delta\tau = 5$ $\mu$sec within the selected period duration T. In order to produce the frequency $f_{IN}$ assigned to the value of L, the output frequency $f_{OUT}$ is compared in a so-called phase locked loop phase control circuit 9 with a reference frequency of 3 kHz produced in a reference oscillator 20. The phase locked loop phase control circuit 9 produces a voltage whose value depends on the amount of the deviation of frequency $f_{OUT}$ from the 3 kHz reference frequency. This voltage produced at the output of phase control circuit 9 as a result of the deviation influences frequency $f_2$ of AFC oscillator 11 so as to reduce the amount of deviation. To produce this result the voltage from phase control circuit 9 is fed via a digital/analog converter 21 to the AFC oscillator 11 as the fine tuning voltage. This forces out an $f_2$ frequency which, according to the programmed divisor, results in the desired $f_{IN}$ frequency since $$f_{IN} = \frac{f_{OUT} \cdot 10,000}{L}$$

and because $f_{OUT}$ is pulled by the phase locked loop phase control circuit 9 to 3 kHz, the reference oscillator frequency. When $f_{OUT} = 3$ kHz, no more fine tuning by AFC oscillator 11 is required. Frequency $f_2$ of AFC oscillator 11 is automatically regulated to such a value until frequency $f_{IN}$ results according to the last listed formula. The number $$L = \frac{f_{OUT} \cdot 10,000}{f_{IN}} \text{ for } f_{IN} =$$

3.33 kHz is $\frac{3 \text{kHz} \cdot 10,000}{3.33 \text{ kHz}} = 9,000,$ and for $f_{IN} = 197.706$ kHz is $$\frac{3 \text{ kHz} \cdot 10,000}{197.706 \text{ kHz}} = 151.74 \approx 152$$

The direct output voltage of the digital/analog converter in dependence on L is $$U_I = \frac{40 \text{ V} \cdot 5 \text{ } \mu\text{sec} \cdot 3 \text{ } kHz \cdot 10^4}{L} = \frac{4,500}{L}$$

if $U_B = 30$ V. The integrating circuit 21a, which is included in the digital/analog converter 21 connected in series with the output of the phase locked loop phase control circuit 9, must also reduce the ripple voltage on the AFC fine tuning voltage to a non-interfering amplitude so that the transient period of the direct output voltage $U_I$ of the entire system is increased to about 0.15 sec.

The step width $\Delta U_I$ of the direct output voltage $U_I$ in the circuit illustrated in FIG. 4 is not constant because the step width resulting, for example at $U_I = 29.5$ V is $$\Delta U_I|_{29.5 \text{ V}} = \frac{4500}{152} - \frac{4500}{153} \approx 193 \text{ mV}$$

while, for example, for $U_I = 0.5$ V the step width is $$\Delta U_I|_{0.5 \text{ V}} = \frac{4500}{9000} - \frac{4500}{8999} \approx 55.6 \text{ } \mu\text{V}$$

The reason for the occurring differences in step width lies only in the special circuit according to FIG. 4 and has nothing to do with the principle of the invention.

Figure 5:
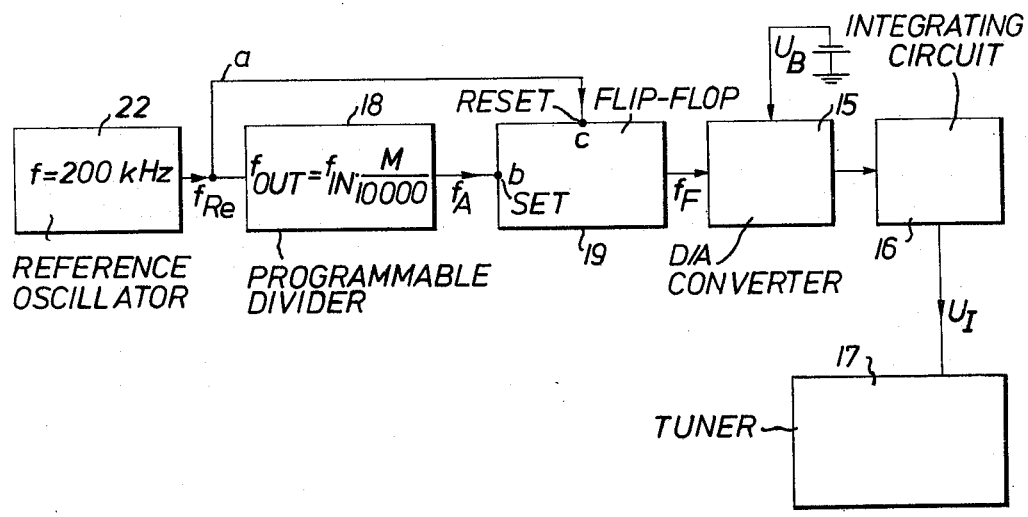
FIG. 5 is a block diagram of another embodiment of the invention.
Figure 7:
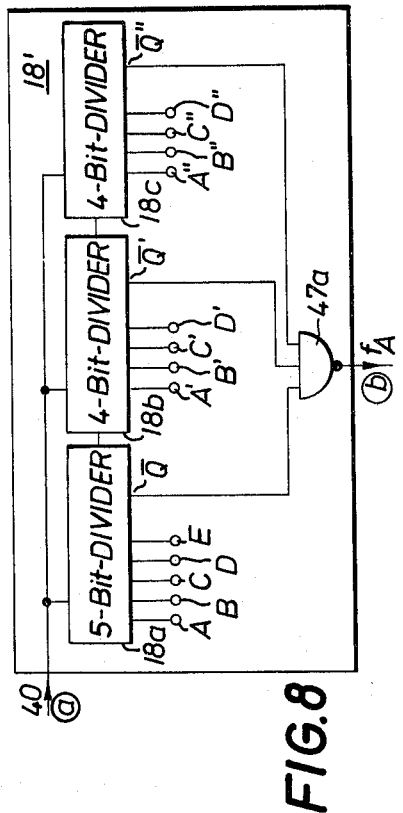
FIG. 7 shows the pulse diagrams for the circuit of FIG. 6.

Another embodiment of the invention, in which the above-mentioned step width is constant, is illustrated in FIGS. 5 and 6, with FIG. 5 being a principle block circuit diagram of the circuit according to FIG. 6. For better understanding of the circuit of FIG. 6, FIG. 7, shows the pulse shapes at the points indicated in FIG. 6 by encircled lower case letters. The circuit of FIG. 5 is distinguished by its simplicity, short transient period with good suppression of the ripple voltage and constant step width of the direct output voltage. Moreover, the stability of the reference oscillator 22 is of subordinate significance because frequency deviations from the rated frequency theoretically do not influence the value of the direct output voltage.

In FIG. 5 the frequency $f_{Re}$ of the reference oscillator 22 is fed to a programmable or settable divider 18 at whose output appears frequency $$f_A = f_{Re} \cdot M/10,000$$

where M may again be programmed or preset as a whole number value from 1 to 9999. Frequency $f_A$ is fed to the setting input b of a flip-flop 19 while frequency $f_{Re}$ of the reference oscillator 22 is fed to the reset input c of flip-flop 19. Pulses at frequency $f_F$ appear at the output of flip-flop 19.

The presence of a pulse may be described by a logic "1". A logic "0" indicates that no pulse is present, the voltage thus is about 0 V. As will be explained below in connection with FIGS. 6 and 7, a "1" potential appears at the output of flip-flop 19 if a logic "1" is present at the setting input b as a result of pulses at frequency $f_A$. Resetting by frequency $f_{Re}$ via the reset input c takes place after one-half period at frequency $f_{Re}$ only if "0" potential is present at setting input b (see FIG. 7). The output pulses of flip-flop 19 are fed to digital/analog converter 15 with series-connected integrating circuit 16, whose direct output voltage $U_I$ tunes the tuner 17 of a television receiver to the desired receiving frequency. The programmable decade divider 18 which here serves only as an example — binary dividers can be organized similarly — emits a certain number of pulses according to value M. These pulses are distributed to the counter positions of the individual counter stages (= divider stages) of divider 18 so that at the output of flip-flop 19 there appears the maximum possible highest frequency $f_F$ obtainable with the divider employed. It must be noted in this connection that each pulse at setting input b of flip-flop 19 is filled to a length of 5 μsec (1 ÷ 200 kHz = 5 μsec), although the pulses at setting input b have a length $\tau = \frac{1}{2} T_A = 2.5$ μsec with $T_A = 1 \div f_A = 1 \div 200$ kHz = 5 μsec. The pulse duration of the pulses at setting input b is thus 2.5 μsec. The pulse width of the pulses, however, at the output of flip-flop 19 is 5 μsec.

The above relationships will be explained in detail with the aid of FIGS. 6 and 7. The pulse shapes shown in FIG. 7 appear at the associated points in FIG. 6 marked there by encircled letters.

In FIG. 6 which shows a circuit according to the principle of FIG. 5, the pulses shown at (a) in FIG. 7 are fed via an input terminal 40 to the divider 18 which includes four presettable decimal divider stages 43–46. The input frequency of the pulses is, for example, $f_{Re} = 200$ kHz. The divider stage 18 can divide the input frequency into a frequency $f_A$ as follows:

$$f_A = f_{Re} \cdot M/10,000$$

where M = 0 ... 9999 can be selectively set via memories 48 or 49. The accuracy of the direct voltage to be produced is thus great enough that 9999 intermediate values are possible for the direct voltage. The available outputs of the decimal divider stages 43 ... 46 are combined via a NAND gate 47. The pulse diagram shown at (b) in FIG. 7 is produced at the output of NAND gate 47 if the decimal divider stages 43 ... 46 were correspondingly preset by memory 48 according to its contents of, for example, seven, zero, zero, zero. In this case M = 7000. The dividing ratio is here seven, i.e. for ten pulses at the input of divider 18, seven pulses appear at the output of divider 18 (see FIG. 7 at (a) and at (b)).

the input frequency $f_{Re}$ is also fed to a separating and differentiating stage 50, 51, so that the output pulses from this stage coincide in time with the negative 200 kHz pulse edges, as shown in FIG. 7 at (c). The pulses at the output of NAND gate 47 of FIG. 6 and at the output of the separating and differentiating stage 50, 51 enable the triggerable flip-flop 19 whose output (d) which is connected to the base of transistor 53 always carries "0" potential if the output (b) of NAND gate 47 is positive — i.e. at "1" potential — independent of the level at output (c) of the separating and differentiating stage 50, 51. Only if output (b) of NAND gate 47 is "0", will output (d) of flip-flop 19 be switched to a "1" signal with the next following differentiated pulse. For successive pulses at output (b) of NAND gate 47, output (d) of flip-flop 19 is always set to a "Low" signal, as shown in FIG. 7 at (d).

The signal at output (d) of flip-flop 19 controls an amplifier and driver stage 53, 54, which switches switching transistor 1 (as in FIG. 2). Switching transistor 1 is connected via its collector resistor 2, to a constant direct voltage U of, for example, 33 volt. Switching transistor 1 switches in the basic raster of, in this case, 5 μsec between this voltage and its saturation voltage of, for example 70 mV. The resulting direct voltage can be fed to the tuner 17 of a television receiver via an integrating circuit formed by the two RC stages 3, 4 and 5, 6 to tune the receiver by means of one or a plurality of variable capacitance diodes 64.

Switching from a low direct voltage, for example 0.4 V, to a high direct voltage, e.g. 30 V, was effected in a reduction to practice of the above-described circuit in about 0.2 seconds. The residual alternating voltage was less than 3 mV. The step width of the direct voltage as 3.3 mV. The following components were employed for the integrating circuit: resistors 3 and 5: 10 kΩ; capacitor 4: 1μF; and capacitor 6: 0.2 μF.

The channel selection in a television receiver is effected in FIG. 6 in that a number for M assigned to the desired channel is stored in one of memories 48, 49. With a switch S the respective memory contents can then be transferred to the decimal divider stages 43–46 so that they are programmed or preset to the desired dividing ratio.

As already mentioned, the number M is used to select the dividing ratio of divider stage 18 and thus the frequency $f_A$ or $f_F$ respectively. If, for example, M is selected to be 165, then the frequency is $$f_F |_{M=165} = 200 \, kHz \cdot \frac{165}{10,000} = 3.3 \, kHz$$

During the time of 1 second flip-flop 19 gives 3300 pulses with a pulse width of $\tau = 5$ μsec to digital-/analog converter 15 so that at $U_B = 30$ V a direct output voltage of $$U_I = \frac{30 \, V \cdot 5 \, \mu sec \cdot 3.3 \, kHz}{1 \, sec} = 0.495 \, V$$

or $$U_I = 30 \, V \cdot \frac{M}{10,000} = 30 \, V \cdot \frac{165}{10,000} = 0.495 \, V$$

respectively, is produced. At this voltage the pulses are distributed over the period duration T = 50 msec so that the intervals between them are still relatively large — with respect to the pulse width of 5 μsec. Thus it is still possible to accommodate a large number of pulses within period duration T. The frequency obtained at the output of flip-flop 19 in the circuit of FIG. 6 rises linearly, in view of the decade divider stages 43-46 employed there, up to M = 4000 where $$f_F|_{M=400} = \frac{200 \text{ kHz} \cdot 4000}{10,000} = 80 kHz$$

The frequency $f_F$ remains constant if M is further increased to M = 5999 although an increase of the value of M causes more pulses of a pulse duration of 5 μsec to be produced within period duration T. The frequency can remain constant because the additional pulses in the range between M = 4000 to M = 5999 are arranged directly next to already available pulses so that two pulses of a pulse width of 5 μsec will blend into a single pulse of the double pulse width of 10 μsec. This is so because beginning with M = 4001, the decade divider stages will place the pulses into two adjacent counting positions. The number of pulses during period duration T thus remains constant between M = 4000 and M = 5999, yet there will be pulses of different pulse widths, either 5 μsec or 10 μsec, depending on which adjacent counting positions are occupied. Since up to the value M = 4000 the intervals between pulses are greater than 5 μsec it cannot happen that placing of one pulse between two others will cause three pulses to blend into one another.

At the value M = 6000 the output frequency $f_F$ jumps to 40 kHz because now two times two counting positions are adjacently occupied and it remains at 40 kHz up to M = 8000. Within this region the pulses which had previously been combined from two 5 μsec pulses into 10 μsec pulses can blend into pulses with a pulse width of 15 μsec if an additional pulse of 5 μsec is added due to an increase in M. This can also be seen in FIG. 7 at (f) where the left-hand pulse has a width of 15 μsec (corresponds to three pulses at 5 μsec) and the pulse next to it has been produced by blending together two 5 μsec pulses.

Beginning with M = 8001 frequency $f_F$ decreases linearly with $$f_F|_{M=8000} = 200 \text{ kHz} \left(1 - \frac{M}{10,000}\right)$$

so that frequency $f_F$ for M = 9853 becomes $$f_F|_{M=9853} = 200 \text{ kHz} (1 - 0.9853) = 200 \text{ kHz} \cdot 0.0165 = 3.3 \text{ kHz}$$

The output voltage at M = 9853 is $$U_I = 30 \text{ V} \cdot 9853/10,000 = 29.595 \text{ V}$$

It would be possible to increase the frequency $f_F$ — and thus also the number of 5 μsec pulses within period duration T — to values greater than M = 4000 in a manner different from that shown in FIG. 6 with the divider stages 43-46 employed in that case. The number of pulses could be increased, for example, until the intervals between pulses would only be 5 μsec, i.e. would be equal to the pulse width itself.

For the following reasons it may prove to be disadvantageous to increase frequency $f_F$ to its maximum possible value. In practice the pulses do not have the ideal shape shown FIG. 3 or FIG. 7. Due to the finite rise and decay time originating from a nonideal transistor switch, the pulses in practice have slightly oblique leading and trailing edges and charge storage delays. This increases the area of the pulses by a slight amount. Since the area of the pulses, however, is also a measure for the voltage obtained by integration, the greater area leads to a higher voltage. Therefore, the higher the number of pulses within period duration T, the greater will be the error manifest in a higher voltage. It is therefore of advantage to increase frequency $f_F$ not to its maximum possible value but to limit the increase to a certain higher value at which the above-described error is negligible.

The enabling frequency $f_F$ for the digital/analog converter 15 in FIG. 5 lies in the direct output voltage range of 0.5 V to 29.5 V, $f_F \geq 3.3$ kHz. If the time constant for the integrating circuit is selected so that the ripple voltage $U_R = 3$ mV, the measured transient time until a stationary value is reached by the direct output voltage $U_I$ is about 0.2 seconds.

Figure 8:
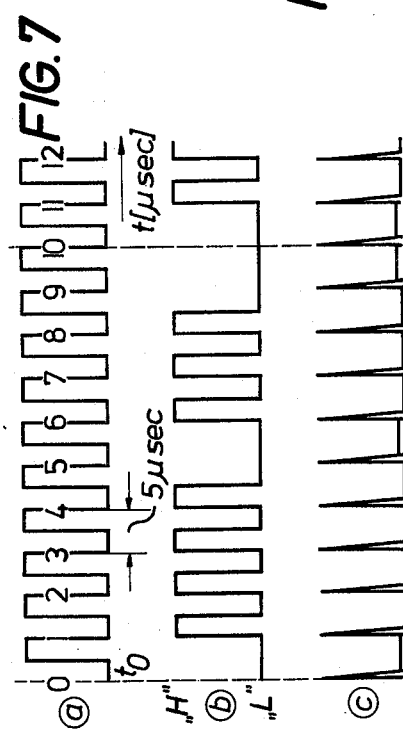
FIG. 8 illustrates a divider stage constructed of binary dividers which can be substituted for the divider stage of FIG. 6.

Due to the above-described finite rise and decay period of a nonideal switching transistor it is advantageous to limit frequency $f_F$ to a certain maximum value which at the present state of the transistor art lies at an optimum frequency $f_{Fopt} = 30$ kHz. This is possible with the use of a correspondingly designed binary divider 18' with states 18a, 18b, 18c as shown in FIG. 8 which is used instead of decimal divider 18 of FIG. 6. Frequency $f_A$ is $$f_A = f_{Re} \cdot M/8192$$

with whole number values of M from 0 ... 8191. By specially designing the programmable 5-bit divider 18a and with the conventional design of the two programmable 4-bit dividers 18b, 18c and with $U_B = 32$ V for, e.g., $U_I = 0.5$ V, frequency $f_F$ at $$M = 0.5 \text{ V}/32 \text{ V} \cdot 8192 = 128$$

$$f_F = f_A = 200 \text{ kHz} \cdot 128/8192 = 3.125 \text{ kHz},$$

i.e. approximately equal to the frequency obtained with the use of a decimal divider. In FIG. 8, the pulses are fed to the first binary divider 18a and the other two binary dividers 18b and 18c via line 40. The outputs Q, Q' and Q'' are combined via a NAND gate 47a at whose output (b) the desired frequency $f_A$ appears which has been divided down by programmable divider 18'. Programmable dividers whose dividing ratio can be influenced by the selection of logic signals fed to their input terminals are known, for example, from "Das TTL-Kochbuch" [The TTL Cookbook], Texas Instruments, Germany GmBH, second edition, 1972, pages 154–157.

Figure 9:
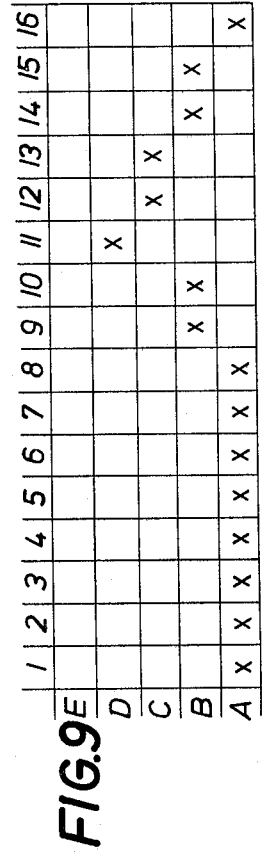
FIG. 9 is a scheme for the logic states at the output terminals of the specially designed 5-bit binary divider 18a of FIG. 8, in dependence on its counting state.

The 5-bit divider 18a has a special design. Its output pulse relations to input code digits are shown in FIG. 9. the two blocks each show at the top the numbers 1 to 31 which indicate the number of pulses fed through line 40. The x's indicate which ones of the input terminals A through E are occupied by a logic "0" (because of the TTL technique) for the purpose of programming the 5-bit divider 18a. If, for example, input terminal D is occupied by a logic "0" the eleventh and the twentyfourth pulse appear at output Q. With a logic "0" at input terminal A the first through eight and the sixteenth through twentythird pulse appear at output Q.

As shown in FIG. 10 by the curve a, if binary dividers 18a, 18b, 18c are used, frequency $f_F$ monotonously increases to 18.725 kHz up to $U_I \approx 3$ V. At the next $\Delta U_I$ step $f_F$ drops back to 12.5 kHz because then two 5 μsec pulses from the 5-bit divider blend into one 10 μsec pulse. Up to a voltage of $U_I = 31$ V, frequency $f_F$ fluctuates between 12.5 and 25 kHz at even higher voltages $U_I$, which however are hardly ever required in practice, it drops again.

For better understanding FIG. 12, which shows another embodiment of the invention, FIG. 11 is analyzed. FIG. 11 shows a pulse ratio counter according to the state of the art, which can be digitally controlled and which produces impulses shown in FIG. 1a or 1b. Counter 66 is driven by the clock generator 65. In intervals of $T = 2^n$ clock pulse durations $\Delta\tau$, counter 66 produces an output pulse. The output clock pulse edge switches multivibrator 69 and thus transistor 1 (as in FIG. 2). At the same time care is being taken that counter 67 counts only to a value M. This can be done by means of a comparison circuit which compares the counting pattern of the counter 67 with a register (not shown) containing value M. A simpler way is to preset counter 67 by means of register 68 which contains the value $2^n - M$ as a binary number. Counter 67 receives the counting pulses via AND gate 70 which is enabled beginning with the clock pulse time and counts off M pulses beginning with the value $2^n - M$ until it reaches the value $2^n$ and thus flips back multivibrator 69. Transistor 1 becomes conductive again after time $\tau = M \cdot \Delta\tau$ when $T = 2^n \cdot \Delta\tau$. Gate 70 is blocked until the end of interval T.

Exactly $2^n$ voltage steps $\Delta U_I$ can be produced with $2^n$ time intervals $\Delta\tau$, where $$\Delta U_I = U \cdot 2^{-n}.$$

The greater the required accuracy, the greater $n$ must become and the greater will be T, when $\Delta\tau$ is limited downwardly by the technology of the total circuitry to a few μsec. Tuning of television receivers requires an accuracy of, for example, $10^{-4}$ or $n = 13$ ($2^n = 8192$). That would result in a T of 40.9 msec with $\Delta\tau = 5$ μsec. A lowpass filter which would have to suppress $10^{-4} = 80$ db, however, would have very high time constants and would require a transient time of many seconds when switched to a new setting, which is unacceptable.

since all time intervals are to be $\Delta\tau$ and the number M ($0 < M < 2^n$) can have any value, a division of the pulse packet $\tau = M \cdot \Delta\tau$ into exactly identical parts of more than one pulse length $\Delta\tau$ is impossible, because M could be a prime number.

FIG. 12 shows an embodiment of the invention in which the direct voltage is produced in that, in a manner different from that explained in connection with FIGS. 4–7, the number of the pulses within the given period duration T is constant and the pulse widths of the pulses within period duration T are varied corresponding to the desired direct voltage value. The pulse widths may differ, as already mentioned, by only certain minimum time intervals $\Delta\tau$. These minimum time intervals are the clock pulse times of a pulse generator 65 in FIG. 12 which drives the pulse ratio counters 66' and 67'. Elements 66', 67' and 68' in FIG. 12 have the same functions as elements 66, 67 and 68 respectively in FIG. 11 but with different numbers of stages ($m$ instead of $n$). Counter 66' distributes the clock pulses over period duration T which hereinafter will also be called the frame length T. According to FIG. 12 period duration $T = 2^n \cdot \Delta\tau$ is therefore divided into P subintervals by counter 66'. It has a capacity of $2^m$ bits and delivers at $2^n/2^m = 2^{n-m} = 2^k = P$ times a start pulse to set multivibrators 69. The length of the P output pulses, generated by multivibrator 69 and transistor 1 is determined by two numbers N and R. N is a measure of the basic pulse length $N \cdot \Delta\tau$. where N lies between 0 and $2^m$ ($0 \leq N \leq 2^m$). During frame length T, R pulses are selected from the P pulses and are extended by $\Delta\tau$.

$$(0 \leq R < P)$$

The sum of all pulse lengths during T is then $$M \cdot \Delta\tau = R \cdot (N + 1)\Delta\tau + (P - R)N \cdot \Delta\tau$$

$$M \cdot \Delta\tau = P \cdot N \cdot \Delta\tau + R \cdot \Delta\tau$$

$$M = P \cdot N + R$$

M is the measure for the output direct voltage $U_I = M \cdot U_{max}/2^n$.

M is the sum of a coarse value $P \cdot N$ and a fine value R. In this way M can represent each integer value between 0 and $2^n$ $$(0 \leq M \leq 2^n).$$

N is mathematically defined as $[M/P] = N$. This expression (written in rectangular brackets) means the integer value of M/P wherein a remainder or numbers behind the decimal point are neglected. R is the remainder of the division $M/P = N + R/P$ or $R = M - P \cdot N$ or $R = M - P[M/P]$. To obtain short transient times for the low pass filter the output pulse frequency should be made as high as possible. To avoid errors caused by non ideal pulse edges the output pulse frequency should be as low as tolerable. A reasonable compromise is reached for example by choosing $k = 7$.

If $n = k + m$ and $n = 13$, so $m = 6$.

If $\Delta\tau = 5$ μsec., each of the $P = 2^k = 128$ subintervals is $2^m \cdot \Delta\tau = 64 \cdot 5 = 320$ μsec. long so the pulse repetition frequency is 3.13 kHz. The pulse frequency of this embodiment of the invention is constant at 3.13 kHz for output voltages $U_I$ from 0.5V to 31.5 V as shown in FIG. 10 (curve $\beta$). For lower and higher voltages $U_I$, the pulse frequency is equal to that of curve $\alpha$ in FIG. 10. To illustrate the generation of N and R if $P = 128$, we assume $M = 3517$. $[M/P] = N = 27$ because $M/P = 27,476562$. The remainder is $R = 3517 - 128 \cdot 27 = 61$. The remainder $R = 61$ can best be added to the 128 pulses in that, of the 128 pulses, $128 - 61 = 67$ pulses have the length of 27 steps of the length $\Delta\tau$, and 61 have the length of $27 + 1$ steps. The 61 extended pulses should then be divided as uniformly as possible over the 128 subintervals so as to avoid the generation of low frequency spectral components from an amassment of the remainder pulses which the filter would be unable to compensate.

For better understanding the numbers M, N and R have been illustrated as decimal numbers. In the realized system they are binary coded numbers and in the disclosed embodiment they are pure dual or binary numbers.

$$M = \underbrace{011011}_{N}\ \underbrace{0111101}_{R} = 3517$$

Dividing of a binary number by a power of two, i.e. $2^k$, is a mere matter of shifting the point to the left by a number of placed equal to the exponent $k$. The values N and R simply stand next to one another. They must merely be processed separately.

FIG. 12 shows the circuit for this purpose derived from the circuit of FIG. 11. Without the pulse extension circuit 71 the pulses will have a length of $N \cdot \Delta\tau$ at the output of the the digital/analog converter. (Register 68 presets the complement $N-1 = 2^m - N$ in counter 67 which then counts N steps.) If the pulse extension circuit 71 or a circuit which suppresses a counting pulse to counter 67 is activated by a pulse selection or remainder distributor 72–75, the output pulse has a length of $N + 1$ steps. The remainder distributor 72–75 is controlled by the $k$-stage clock pulse divider 72. The field of gates 74 (only two of which are shown) activated by register 75 with remainder R determines which "0" to "1" transition of the stages of counter 72 is to effect a pulse extension by $1 \cdot \Delta\tau$ via NOR gate 73. The stages of the lowest value of R enable those gates 74 which lie at the divider stage with the most uncommon transitions and vice versa. The process can be used for pure binary and otherwise binary coded number codes and any desired number of digits. For example, in the integrated circuit art counter 72 may be a synchronous counter in which the transitions from "0" to "1" are selected with the aid of gates. Slight extensions of these gates then permit the selection of transitions under the control of register 75. In order to demonstrate its mode of operation, FIG. 14 assumes but eight subintervals $(t_p)$ whose counter positions in counter 72 are listed above the columns. The rows are reserved for the individual remainder values R. The x'ed fields show the time locations at which extended pulses are produced (in FIG. 13 the pulses for R = 100 (binary) = 4 are shown) in that a transition from "0" to "1" by one of the gates 74 (FIG. 12) causes a pulse extension in pulse extension circuit 71 by one step via NOR gate 73. It can be seen that in FIG. 14 stage $2^0$ of register 75 controls the transition from "0" to "1" of the third stage of counter 72 for R, stage $2^1$ controls the transition of the second stage and stage $2^2$ the transition of the first stage of counter 72. The greatest nonuniformity of distribution that could happen is at $1 \cdot \tau$ for an odd-numbered R over the time period of T.

The function of uniform distribution of the remainder pulses can also be realized with one of the known programmed binary counters, e.g. counter 7497, in the TTL technique. The modules 72, 73 and 74 shown in FIG. 12 can be replaced by a programmed binary counter if the outputs of registers 75 are connected to the control inputs of the counter and the output for thedivided counter frequency is connected with the pulse extension circuit.

To estimate the resulting increased noise at the output of the filter, its pulse reply is superposed for a pulse of the length $\Delta\tau$ (76 in FIG. 15) on the measured or calculated value of the normal interfering voltage 77. Since the filter, however is able to compensate pulses of a time $N \cdot \Delta\tau$ ($0 < N < 2^m$) except for the permissible residual ripple 78, the influence of this pulse reply 76 and 77 remains below $2^{-n} \cdot U$ and does not matter.

With the invention it is possible, with low technical expenditures, to realize the circuit as an integrated circuit, to obtain the most favorable time structure for a pulse ratio digital/analog converter with high resolution and short transient time and the influence of the switching edge is reduced to a minimum.

It will be understood that the above description of the present invention is susceptible to various modifications, changes and adaptations, and the same are intended to be comprehended within the meaning and range of equivalents of the appended claims.

What is claimed is:

1. In a circuit arrangement for producing direct voltages lying within a direct voltage range from pulses fed to an integrating circuit at whose output the direct voltages ($U_1$) appear, particularly, to produce tuning voltages for a television or radio receiver, comprising in combination: an integrating circuit; and pulse generating means, having its output connected to the input of said integrating circuit, for producing and feeding to said integrating circuit a number of constant amplitude pulses (I), whose total area is related to the desired circuit voltage output, distributed over a uniform number of subintervals within a period duration (T) assigned to the desired direct voltage range, with the period duration (T) being at least of the magnitude $T = (U_{max} - U_{min}) \cdot \Delta\tau/\Delta U_I$, where $(U_{max} - U_{min})$ is the desired direct voltage range, $\Delta\tau$ is the shortest time duration of a pulse (I), and $\Delta U_I$ is the smallest voltage step width associated with the shortest pulse time duration $\Delta\tau$ by which two different direct voltage values ($U_I$) at least differ from one another, said pulse generating means including means for selectively varying the pulse widths of said pulses (I) corresponding to the desired direct voltage $U_I$; the improvement wherein said pulse generating means further includes a clock pulse generator for producing clock pulses having a pulse width of $\Delta\tau$, and wherein said means for selectively varying the pulse widths includes: a digitally controlled pulse ratio counter means, whose counting ratio can be varied externally by a certain value at given times and to which said clock pulses are fed, for producing pulse widths having an integer value $[M/P] \cdot \Delta\tau$, where M is an integer number which determines the desired direct voltage value ($U_I$) and P is the number of subintervals in said period duration T; and a pulse selection means which operates with the aid of number codes and is controlled by the remainder value R, where $R = M - [M/P] \cdot P$, where $[M/P] =$ the integer number value of M/P, said pulse selection means being connected to said ratio counter means for associating the R pulses as uniformly as possible to said subintervals P provided within said period duration and for varying, with said R pulses, the pulse ratio by a fixed value.

2. A circuit arrangement as defined in claim 1 wherein said pulse selection means controls said ratio counting means to cause same to produce, within said period duration, P-R pulses of a length $[M/P] \cdot \Delta\tau$, and R pulses of a width $([M/P] + 1) \cdot \Delta\tau$.

3. A circuit arrangement as defined in claim 1 wherein said period duration (T) which has a length of $2^n$ clock pulse times (minimum time intervals $\Delta\tau$) is divided into $P = 2^k$ sub-intervals with a length of $2^m \cdot \Delta\tau = n - n - k \cdot \Delta\tau$, with the basic length N of the pulses of the subintervals P being represented by the first $m$ bits of the binary word for M and the remainder R being represented by the next following $k$ bits.

4. A circuit arrangement as defined in claim 1 wherein said pulse selection means includes a programmable counter connected to a first output of said pulse ratio counter means; controllable pulse extension means connected in series with a second output of said pulse ratio counter means for selectively extending the length of an output pulse from said pulse ratio counter means; an entry register for the remainder R; and gate means, connected to the individual stages of said programmable counter and controlled by the state of the respective bits in said entry register corresponding to the value of said remainder R, for feeding signals corresponding to the changes of state of individual stages of said programmable counter to said pulse extension means via a NOR circuit, said gate means being connected to said programmable counter and said entry register in such a manner that the remainder bit of a value $2^0$ is associated with the counter stage transitions at the lowest frequency, while the remainder bits with a multiple of this value $2^0 = 1$ are associated with the counter stage transitions with the same multiple of the lowest frequency.

5. A circuit arrangement as defined in claim 4 wherein said pulses which are uniformly distributed over the period duration T are formeld by addition of pulses of the time duration of the minimum time interval $\Delta\tau$ whose number determines the pulse width.

6. A circuit arrangement as defined in claim 5 wherein said pulse ratio counter includes a first and second divider stage each having its respective input connected to the output of said clock pulse generator, and whose outputs constitute said first and second outputs respectively of said pulse ratio counter means; a flip-flop at whose output the desired pulses appear, said flip-flop having one control input connected to said output of said first divider stage and a second control input connected to the output of said second divider stage via said controllable pulse extension means so that said first divider stage determines the beginning of the output pulse of said flip-flop and said second divider stage determines its end.

7. A circuit arrangement as defined in claim 6 wherein the dividing ratio of said first divider stage determines the length of the subinterval P.

8. A circuit arrangement as defined in claim 7 wherein said second divider stage is a presettable counter which is preset via an entry register at the beginning of the periods to a value $N-1$ (complement of $N-1$), where N is the desired dividing ratio which determines the length of the pulses.

9. A circuit arrangement as defined in claim 8 wherein said pulse extension means extends the pulse width of the output pulse of said flip-flop by the width $\Delta\tau$ of the shortest pulse.

* * * * *